United States Patent
Sherwin et al.

(10) Patent No.: US 10,490,974 B2
(45) Date of Patent: Nov. 26, 2019

(54) SELF-REFERENCING FREQUENCY COMB BASED ON HIGH-ORDER SIDEBAND GENERATION

(71) Applicant: The Regents of the University of California, Oakland, CA (US)

(72) Inventors: Mark Sherwin, Goleta, CA (US); Hunter Banks, Washington, DC (US); Darren Valovcin, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/941,777

(22) Filed: Mar. 30, 2018

(65) Prior Publication Data

US 2018/0301868 A1    Oct. 18, 2018

Related U.S. Application Data

(60) Provisional application No. 62/479,808, filed on Mar. 31, 2017.

(51) Int. Cl.
| | |
|---|---|
| *G02F 1/35* | (2006.01) |
| *H01S 5/04* | (2006.01) |
| *H01S 5/34* | (2006.01) |
| *H01S 5/343* | (2006.01) |
| *H03K 4/06* | (2006.01) |

(52) U.S. Cl.
CPC ............ *H01S 5/041* (2013.01); *G02F 1/35* (2013.01); *H01S 5/3408* (2013.01); *H01S 5/3432* (2013.01); *H01S 5/3434* (2013.01); *H01S 5/3438* (2013.01); *H01S 5/34313* (2013.01); *H01S 5/34346* (2013.01); *H01S 5/34353* (2013.01); *H03K 4/06* (2013.01); *G02F 2203/56* (2013.01)

(58) Field of Classification Search
None
See application file for complete search history.

(56) References Cited

U.S. PATENT DOCUMENTS

| | | | |
|---|---|---|---|
| 7,239,442 B2 * | 7/2007 | Kourogi | G02F 1/21 359/333 |
| 7,551,342 B2 * | 6/2009 | Kourogi | G02F 1/0311 359/245 |
| 7,712,977 B2 * | 5/2010 | Kourogi | G02F 1/225 359/346 |

(Continued)

OTHER PUBLICATIONS

D. Valovcin, H. B. Banks, S. Mack, A. C. Gossard, L. Pfeiffer, and M. S. Sherwin, "High-Order Sideband Generation in Semiconductors: Beyond the Three Step Model," in Conference on Lasers and Electro-Optics, OSA Technical Digest (online) (Optical Society of America, 2016), paper JW2A.65. (Year: 2016).*

(Continued)

*Primary Examiner* — Rhonda S Peace
(74) *Attorney, Agent, or Firm* — Gates & Cooper LLP

(57) ABSTRACT

A frequency comb generator including a semiconductor, wherein the semiconductor outputs a frequency comb in response to frequency mixing of an optical field and at terahertz field in the semiconductor using a high order sideband (HSG) mechanism. The frequency comb spans a bandwidth sufficient for self-referencing and may be used in optical clock applications, for example.

22 Claims, 10 Drawing Sheets

(56) References Cited

U.S. PATENT DOCUMENTS

| | | | |
|---|---|---|---|
| 7,982,944 B2* | 7/2011 | Kippenberg | G02F 1/39 359/245 |
| 9,190,797 B2* | 11/2015 | Schneider | H01S 3/0078 |
| 9,746,748 B2* | 8/2017 | Vampa | G02F 1/353 |
| 9,903,808 B2* | 2/2018 | Plusquellic | G01N 21/255 |
| 10,067,031 B2* | 9/2018 | Vahala | G01M 11/333 |
| 2018/0252985 A1* | 9/2018 | Vainio | G02F 1/3544 |
| 2018/0301868 A1* | 10/2018 | Sherwin | H01S 5/041 |

OTHER PUBLICATIONS

Del'Haye, Pascal & Schliesser, Albert & Arcizet, Olivier & Wilken, T & Holzwarth, Ronald & Kippenberg, Tobias. (2008). Optical Frequency Comb Generation from a Monolithic Microresonator. Nature. 450. 1214-7. 10.1038/nature06401. (Year: 2008).*

P. Cavalié et al., "High order optical sideband generation with Terahertz quantum cascade lasers," 2013 38th International Conference on Infrared, Millimeter, and Terahertz Waves (IRMMW-THz), Mainz, 2013, pp. 1-1. (Year: 2013).*

Cao, Cong & Mi, Sichen & Wang, Tie-Jun & Zhang, Ru & Wang, Chuan. (2016). Optical High-Order Sideband Comb Generation in a Photonic Molecule Optomechanical System. IEEE Journal of Quantum Electronics. 52. 1-1. 10.1109/JQE.2016.2563779. (Year: 2016).*

Jing Wang, Zhaohong Han, Yuhao Guo, Lionel C. Kimerling, Jurgen Michel, Anuradha M. Agarwal, Guifang Li, and Lin Zhang, "Robust generation of frequency combs in a microresonator with strong and narrowband loss," Photon. Res. 5, 552-556 (2017). (Year: 2017).*

Banks et al., "Dynamical Birefringence: Electron-Hole Recollisions as Probes of Berry Curvature". Physical Review X 7, pp. 041042-041042-21 (2017).

Valovcin et al., "Optical Frequency Combs From High Order Sideband Generation". Unpublished Manuscript, 8 pages, 2018.

Banks, H., "Electron-Hole Recollisions in Driven Quantum Wells", A dissertation submitted in partial satisfaction of the requirements for the degree of Doctor of Philosophy in Physics, University of California, Santa Barbara, Dec. 2016, pp. 1-169.

Valovcin, D., et al., "Bandwidth Control of Near Infrared Frequency Combs in High-Order Sideband Generation," in Presentation at 2017 Conference on Lasers and Electro-Optics (CLEO), May 14-19, 2017, San Jose CA.

Valovcin, D., et al.,"Berry Curvature-Induced Dynamical Birefringence from Electron-Hole Recollisions" in Presentation at Optical Terahertz Science and Technology Conference, Apr. 6, 2017, University College London, UK, p. 92 in https://docplayer.net/88826831-Otst-april-2017-university-college-london-london-uk.html.

Valovcin, D., et al. "Bandwidth Control of Near Infrared Frequency Combs in High-Order Sideband Generation,",  Cleoabstract ID dated Mar. 15, 2017, for Presentation at 2017 Conference on Lasers and Electro-Optics (CLEO), May 14-19, 2017, San Jose CA.

Valovcin, D., et al. "Polarimetry of THz High-Order Sideband Generation: Towards a Measurement of Berry Curvature," in Conference on Lasers and Electro-Optics, OSA Terchnical Digest (online) (Optical Society of America, 2018), paper FM3F.4, pp. 1-2.Presentation May 13-18, 2018.

Banks, H., et al., "Terahertz Electron-Hole Recollisions in GaAs/AlGaAs Quantum Wells: Robustness to Scattering by Optical Phonons and Thermal Fluctuations", Physical Review Letters, 2013, pp. 267402-1-267402-5, vol. 111.

Banks, H., et al., "Antenna-boosted mixing of terahertz and near-infrared radiation", Applied Physics Letters, 2014, pp. 092102-1-092102-4, vol. 105.

Banks, H., et al., "Dynamical Birefringence: Electron-Hole Recollisions as Probes of Berry Curvature", Physical Review X, 2017, pp. 041042-1-041042-21, vol. 7.

Valovcin, D.C., et al., "Optical frequency combs from high-order sideband generation", Optics Express, Nov. 12, 2018, pp. 1-10, vol. 26, No. 23.

Zaks, B., et al., "High-order sideband generation in bulk GaAs", Applied Physics Letters, 2013, pp. 012104-1-012104-4, vol. 102.

Zaks, B., et al., "Experimental observation of electron-hole recollisions", Nature, Mar. 29, 2012, pp. 580-583, vol. 483.

Torres-Company, V., et al., "Optical frequency comb technology for ultra-broadband radio-frequency photonics", Laser Photonics Rev., 2014, pp. 368-393, vol. 8, No. 3.

Ludlow, A.D., et al., "Optical atomic clocks", Reviews of Modern Physics, Apr.-Jun. 2015, pp. 637-701, vol. 87.

Beha, K., et al., "Electronic synthesis of light", Optica, Apr. 2017, pp. 406-411, vol. 4, No. 4.

Herr, T., et al., "Universal formation dynamics and noise of Kerr-frequency combs in microresonators", Nature Photonics, Jul. 2012, pp. 480-487, vol. 6.

Radisic, V., et al., "Sub-Millimeter Wave InP Technologies and Integration Techniques", 2015 IEEE MTT-S International Microwave Symposium, May 2015, pp. 1-4.

Tucek, J.C., et al., "220 GHz Power Amplifier Development at Northrop Grumman", IVEC 2012, Apr. 2012, pp. 553-554.

Kippenberg, T.J., et al., "Microresonator-Based Optical Frequency Combs", Science, Apr. 29, 2011, pp. 555-559, vol. 332.

* cited by examiner

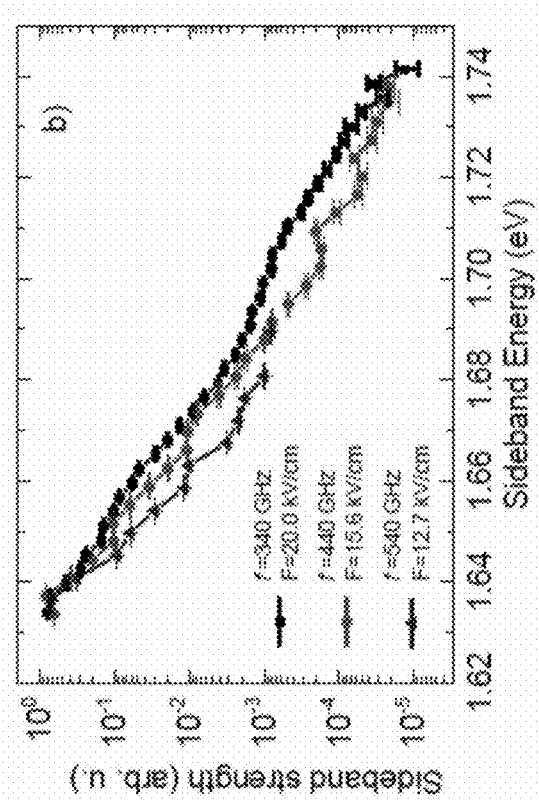
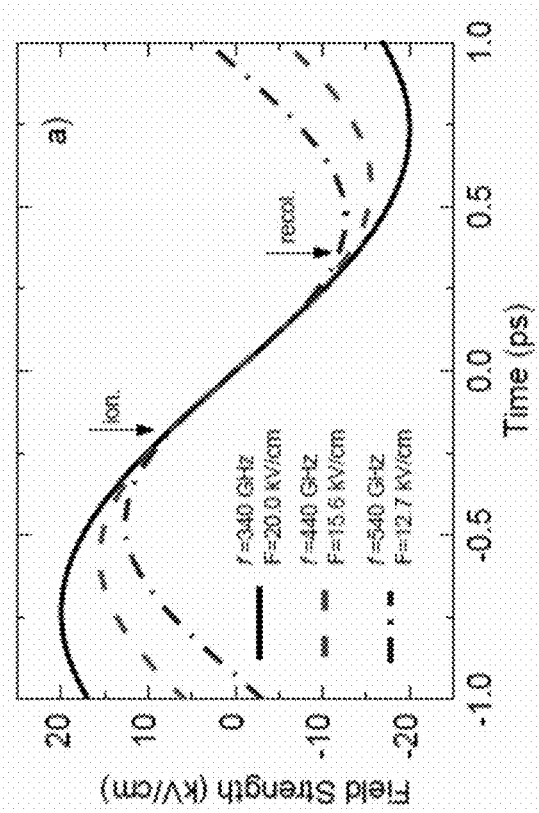
FIG. 4A
FIG. 4B

SELF-REFERENCING FREQUENCY COMB BASED ON HIGH-ORDER SIDEBAND GENERATION

CROSS REFERENCE TO RELATED APPLICATIONS

This application claims the benefit under 35 U.S.C. Section 119(e) of commonly-assigned U.S. Provisional Patent Application Ser. No. 62/479,808, filed on Mar. 31, 2017, by Mark Sherwin et. al, entitled "A CAVITY-FREE SELF REFERENCING FREQUENCY COMB," client reference number 2017-604, which application is incorporated by reference herein.

STATEMENT REGARDING FEDERALLY SPONSORED RESEARCH AND DEVELOPMENT

This invention was made with Government support under Grant No. DMR 1405964 awarded by the National Science Foundation to Mark Sherwin. The government has certain rights in the invention.

BACKGROUND OF THE INVENTION

1. Field of the Invention

This invention relates to the generation of frequency combs.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Self-referencing frequency combs with low cost, size weight and power (CSWaP) are important for "set-and-forget" optical clocks (clocks whose output is derived from an optical frequency standard), spectroscopy, optical communications, and other applications. In order to be capable of self-referencing, frequency combs must span at least ⅔ of an octave, where an octave corresponds to a 2 to 1 frequency range. The two principal existing methods of generating self-referencing frequency combs require that a cavity be tuned in order to adjust the comb's tooth spacing. For a given cavity-based implementation, the range over which the tooth spacing can be varied is determined by the fractional changes in cavity length that are possible, typically <1%. The required cavities also result in challenges to either stability or miniaturization. Octave-spanning frequency combs (covering a 2 to 1 frequency range) based on mode-locked lasers have unparalleled performance but are difficult to miniaturize. In such combs, the tooth spacing is primarily determined by the length of the laser's cavity, but may also be influenced by complex dynamics of the laser gain medium. In comb sources based on high-Q microresonators, which are currently being intensively studied for use as frequency combs with small CSWaP [1], the tooth spacing is determined by the geometry and dielectric properties of the microresonator. A major challenge for microresonator-based combs is to suppress the phase noise that arises from the competing and spatially-distributed nonlinear-optical processes underlying comb formation in the microresonators that give rise to frequency combs in these systems [2].

The simplest method of generating a frequency comb is opto-electronic frequency comb generation [16]. In opto-electronic frequency combs, a continuous-wave (CW) laser is coupled to an optical system that contains one or several modulators that are driven by an external radio-frequency (RF) oscillator. At the output, a comb emerges with the central wavelength defined by the CW laser, and the frequency spacing fixed by the oscillator frequency. In opto-electronic frequency combs, both the spacing between teeth and the central wavelength can be easily tuned by varying the frequency of the RF oscillator and the CW laser, respectively. However, the total bandwidth of opto-electronic frequency combs is typically less than a few THz for CW laser frequencies near 200 THz, corresponding to only a few % of an octave. Thus, while opto-electronic frequency combs are much simpler than combs based on mode-locked lasers or microresonators, they are currently, on their own, incapable of producing a self-referencing frequency comb. We note that opto-electronic frequency combs have recently formed the basis for an octave-spanning, self-referencing frequency comb. Achieving an octave span required sending the output of an opto-electronic frequency comb through a series of amplifiers, highly-nonlinear optical fibers, filters, and other components [17].

SUMMARY OF THE INVENTION

To overcome the limitations in the prior art described above, and to overcome other limitations that will become apparent upon reading and understanding the present specification, the present disclosure describes a new mechanism for generating self-referencing frequency combs with small CSWaP that does not require cavities at all, removing a significant complexity. The cavity-free frequency comb generator includes a semiconductor outputting a frequency comb in response to frequency mixing of an optical field and a terahertz field using a high order sideband (HSG) mechanism. Surprisingly, the frequency comb spans a bandwidth sufficient for self-referencing. In one example, a method for using the frequency comb to stabilize an optical clock is described.

Thus, the present disclosure describes a frequency comb generator, comprising a semiconductor outputting a frequency comb in response to frequency mixing of an optical field and a terahertz field in the semiconductor using a high order sideband generation (HSG) mechanism.

The frequency comb may be embodied in many ways including, but not limited to, one or any combination of the following examples.

1. The frequency comb generator wherein the semiconductor has a bandstructure, including a valence band and a conduction band, such that the semiconductor outputs the frequency comb in response to the terahertz field driving electrons and holes in the bandstructure, after the optical field excites the electrons into the conduction band and excites the holes into the valence band.

2. The frequency comb generator wherein the frequency comb has/spans a bandwidth comprising/spanning at least one octave, at least 67% of an octave, and/or wherein the bandwidth is sufficient for 3f-2f self referencing.

3. The frequency comb generator further comprising a transmission line on the semiconductor, wherein the transmission line may include a resonator that enhances the terahertz field so that the transmission line couples the terahertz field into semiconductor with an electric field strength of at least 10 kV/cm.

4. The frequency comb generator wherein a THz frequency and electric field strength of the terahertz field are chosen by maximizing the product of the THz frequency and electric field strength available at that frequency.

5. The frequency comb generator coupled to an optical clock.

6. The frequency comb generator coupled to an optical clock wherein one tooth of the frequency comb is locked to a microwave frequency standard, and another tooth of the frequency comb is locked to an optical frequency standard, such that the optical frequency standard stabilizes the microwave frequency standard via the frequency comb.

7. The frequency comb generator coupled to a source emitting the terahertz field having a frequency in a range of 200-900 GHz, and a source emitting the optical field having a wavelength of 700 nm-3 micrometers.

8. The frequency comb generator coupled to a source comprising a frequency multiplier chain outputting the terahertz field, wherein the frequency multiplier chain converts a microwave field into the terahertz field.

9. The frequency comb generator wherein the semiconductor has crystallographic directions, the optical field and terahertz field each have a linear polarization, and a direction of the linear polarization of the terahertz field with respect to the crystallographic directions and a direction of the linear polarization of the optical field with respect to the terahertz field may be chosen together to maximize a bandwidth of the frequency comb.

10. The frequency comb generator wherein the optical field and the terahertz field each have a linear polarization and the optical field is polarized perpendicular to the terahertz field. In one or more examples, the optical field and the terahertz field each have a linear polarization and the optical field is polarized at an angle $\theta$ with respect to the terahertz field, with 45 degrees<$\theta$<135 degrees.

The frequency comb of one or any combination of the preceding examples 1-10 may comprise the semiconductor including a bulk semiconductor, wherein the bulk semiconductor outputs the frequency comb in response to the terahertz field driving electrons and holes in the bulk semiconductor, after the optical field excites the electrons into the conduction band of the bulk semiconductor and excites the holes into the valence band of the bulk semiconductor. In one example, the bulk semiconductor comprises bulk GaAs, bulk $Al_xGa_{1-x}As$ (0<x≤1), or bulk $In_xGa_{1-x}As_yP_{1-y}$ (0≤x≤1, 0≤y≤1) and where the thickness of the bulk semiconductor is between 0.2 and 20 microns thick. In another example, the bulk semiconductor comprises $In_{0.53}Ga_{0.47}As$ that is about 1 μm thick.

The frequency comb of one or any combination of the preceding examples 1-10 may comprise the semiconductor wherein the bandstructure comprises a quantum well structure. In one example, the quantum well structure comprises GaAs quantum wells and AlGaAs barriers. In yet another example, the quantum well structure comprises $In_xGa_{1-x}As_yP_{1-y}$ lattice-matched to InP. In yet a further example, the quantum well structure comprises one or more $In_xGa_{1-x}As$ wells with 0.4<x<0.6, the $In_xGa_{1-x}As$ wells having $In_yAl_{1-y}As$ barriers with 0.4<y<0.6 or InP barriers. In yet a further example, the composition and width of the quantum wells are chosen in order to achieve, simultaneously:

a. a desired two dimensional (2D) band gap (the energy difference between a top of the highest valence subband band and a bottom of the lowest conduction subband) is between 500 meV and 1000 meV; and b. an offset between the bottom of the lowest electron subband (in the quantum well structure) and the continuum states (in the barrier between quantum wells) that is at least 0.5 times the 2D band gap so that the electrons with kinetic energy sufficient to emit the sidebands with a photon energy at least 1.5 times the band gap do not escape from the quantum wells.

The present disclosure further describes a method of generating a frequency comb, comprising obtaining a semiconductor comprising a bandstructure including a valence band, a conduction band, and a bandgap; irradiating the semiconductor with an optical field having a frequency corresponding to an energy equal to or larger than the bandgap, so that the optical field excites electrons into the conduction band and holes into the valence band; using a terahertz field to drive the electrons in the conduction band and drive the holes in the valence band; and selecting an intensity of the terahertz field, a timing of the terahertz field with respect to the optical field, and the bandstructure such that the semiconductor outputs a frequency comb having a bandwidth sufficient for self-referencing.

BRIEF DESCRIPTION OF THE DRAWINGS

Referring now to the drawings in which like reference numbers represent corresponding parts throughout:

FIG. 4A illustrates time traces of three separate THz field profiles where the product of field and frequency is approximately equal. The arrows indicate the times when and exciton would be created and recollide, respectively, to generate a sideband offset of approximately 100 meV (70th order at 340 GHz).

FIG. 4B illustrates measured sideband spectra for the driving fields depicted in FIG. 4A. All three spectra show very similar fall-off profiles and overall spectral bandwidth. The spectrum at 540 GHz has a noise floor roughly two orders of magnitude larger than the other two due to shorter integration times. Each sideband from a spectrum, such as the one depicted in FIG. 4B, is fit to a Gaussian whose integral is plotted here as the sideband strength.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Technical Description

Figure 1A:
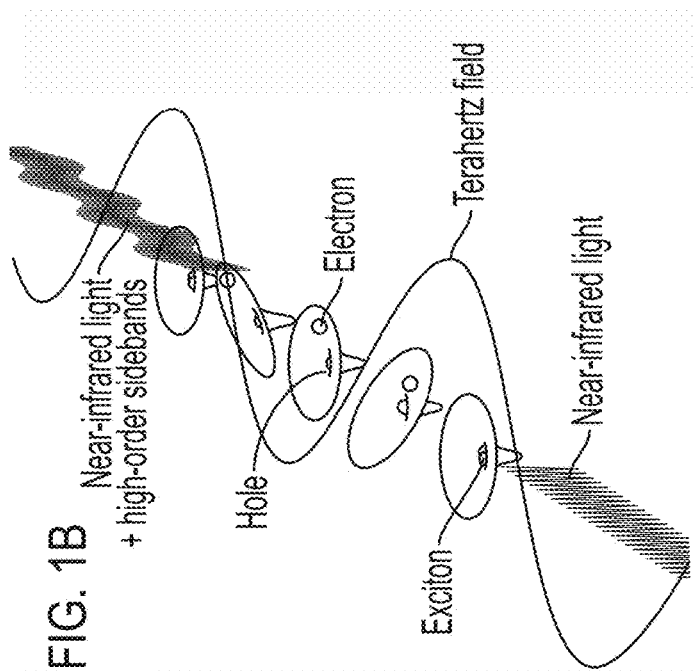
FIG. 1A illustrates a system for generating a frequency comb based on high-order sideband generation.

High-order Sideband Generation (HSG) is a new phenomenon wherein light interacts with matter [3-7]. The phenomenon arises when the frequency of a weak optical beam (e.g., near IR laser beam) is tuned near the bandgap of a semiconductor that is simultaneously driven by a strong beam of sub-THz radiation (FIG. 1A). The NIR laser beam injects excitons (Coulomb-bound electron-hole pairs) which are immediately ionized by the THz radiation. The resulting electron and hole are accelerated first away from each other, and then back towards each other. When the electrons and holes recombine, their considerable excess kinetic energy is emitted in sidebands with higher frequency than the NIR laser.

Figure 1B:
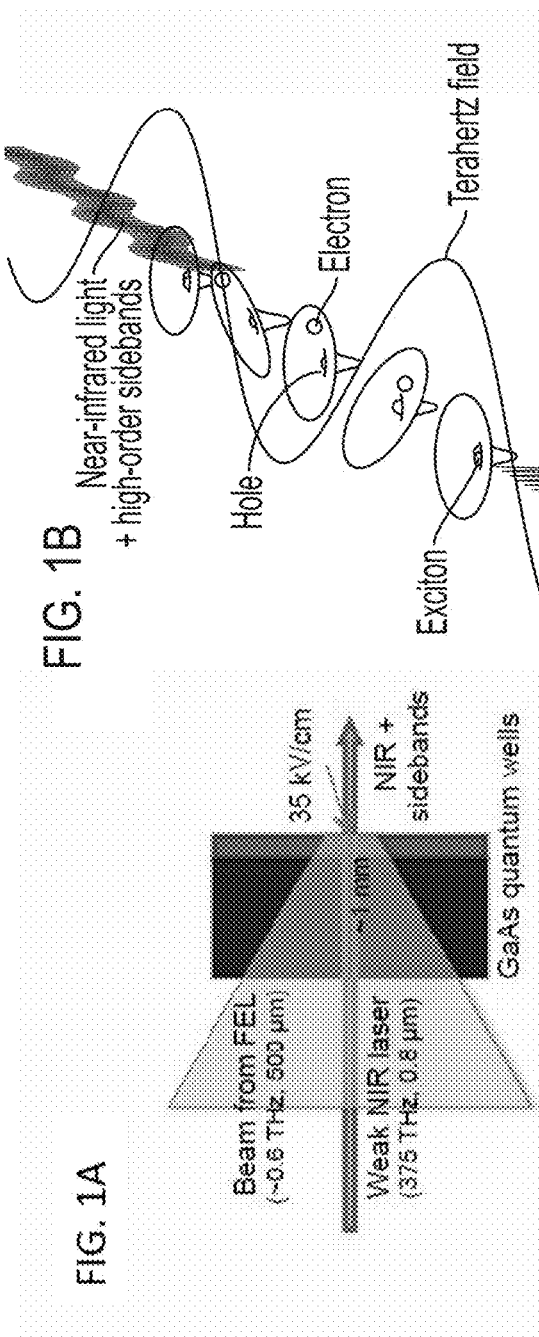
FIG. 1B illustrates electron-hole collisions induced by strong Terahertz field.

FIG. 1B illustrates an electron-hole collider, the device that generates frequency combs via HSG.

Figure 1C:
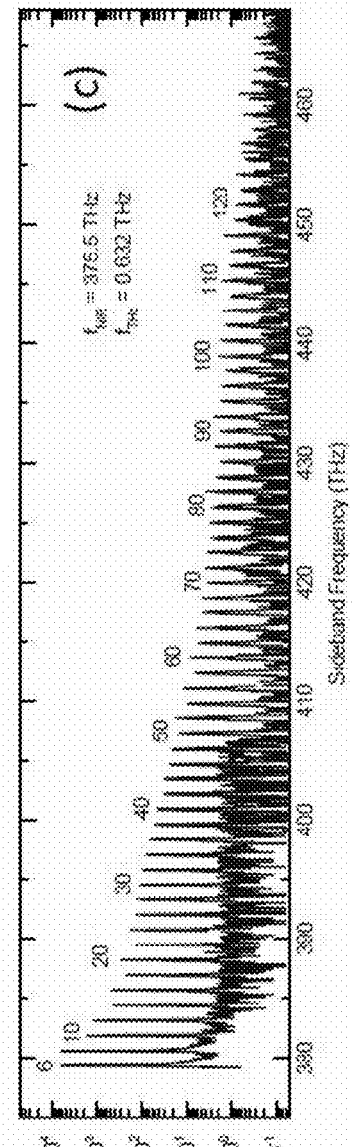
FIG. 1C is a graph showing an experimentally-measured frequency comb spanning more than 80 THz and generated in GaAs quantum wells.

The sidebands form a frequency comb wherein one tooth is the near-IR laser line (hereafter, the comb anchor frequency $f_A$), and the tooth spacing is twice the frequency of the THz radiation. FIG. 1C illustrates an experimentally-measured frequency comb spanning more than 80 THz, with a tooth spacing of 1.26 THz, obtained using THz fields generated by the free electron laser at the University of California at Santa Barbara [8]. While a large free electron laser facility is currently used to generate the required THz fields that are inputted into the electron-hole collider, generation of comparable fields with much more compact form factors (e.g., chip based THz sources) is also possible, as described below.

1. Example Chip Design for a Compact Electron-Hole Collider

Although a free-electron laser is currently used to observe HSG, it is possible to generate the required fields at frequencies of interest using careful microwave engineering/design and many orders of magnitude less power [4].

Figure 2:
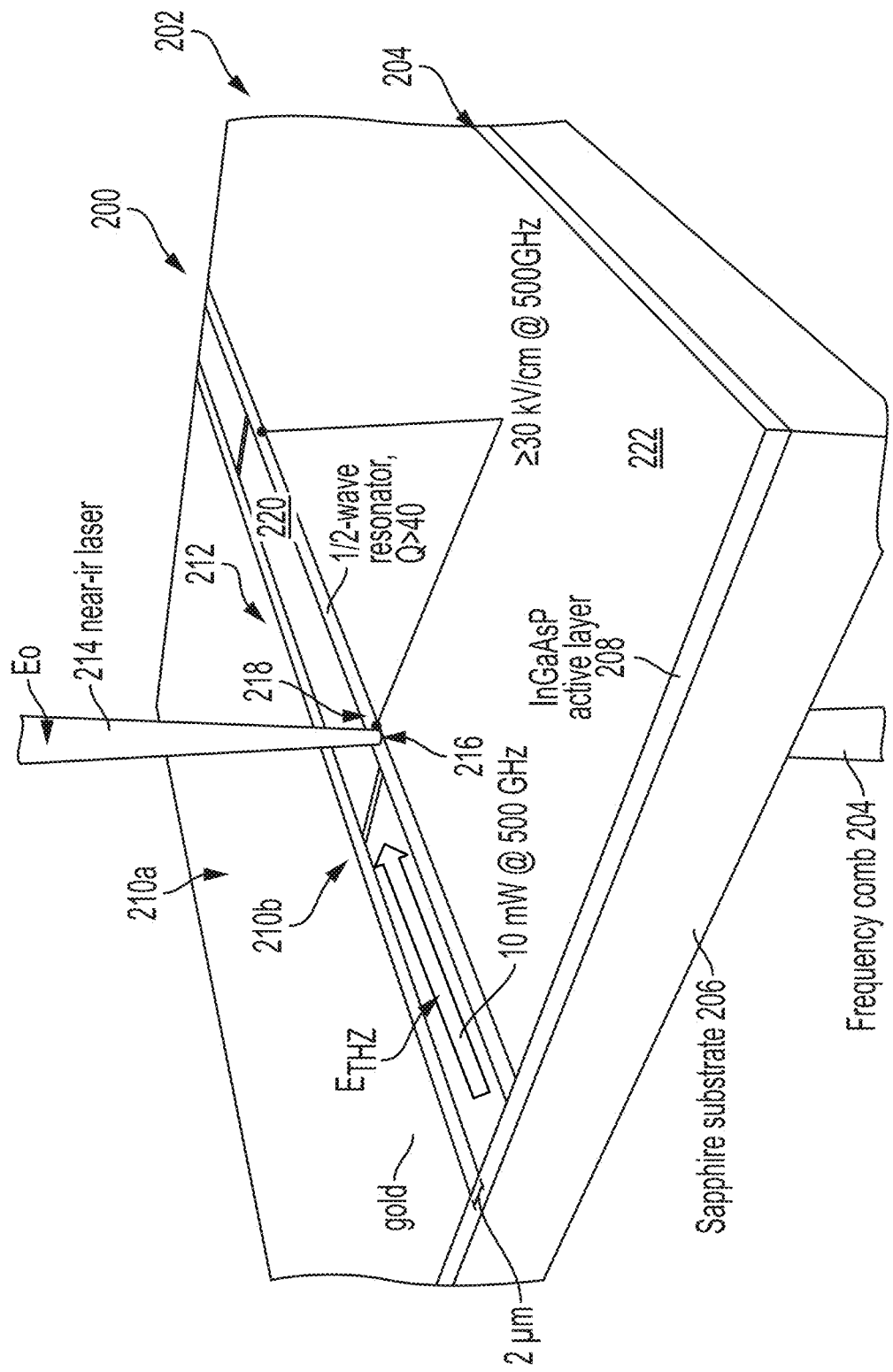
FIG. 2 is a schematic diagram of one possible implementation of a quasiparticle collider on a chip.

FIG. 2 is a schematic diagram of an electron-hole collider 200 on a chip 202 comprising a semiconductor 204 and a sapphire substrate 206, wherein the estimated power requirements—both for the THz and for the near-IR (comb anchoring) laser are rather small. The semiconductor 204 comprises an active region 208 including an epitaxial layer of InGaAsP quantum wells grown on an InP substrate that was subsequently transferred to the sapphire substrate 206 as described in [3]. A transmission line 210a comprising a coplanar waveguide 210b coupled to a ½-wave resonator 212 is deposited on the surface of the active region 208. A near-IR laser beam 214 having an optical field Eo is focused to a diffraction-limited spot 216 near one end of the resonator 212 and in the gap 218 between center conductor 220 and ground plane 222. In one example, 10 mW of 0.5 THz radiation $E_{THz}$ coupled into a resonator with a Q of 40 results in an electric field of 30 kV/cm oscillating at 0.5 THz. This is comparable to the fields created by focusing ~30 kW from the UC Santa Barbara Free-Electron Laser down to a diffraction-limited spot with a diameter of order 1 mm (experimental results are shown in FIG. 1C). A frequency comb 224 consisting/comprising of the near-IR laser and sidebands is generated in the active region 208 and transmitted through the substrate 206.

Various sub-THz sources may be used to convert microwaves into the sub-THz to drive compact electron-hole colliders. In one embodiment, an amplifier pumped by a frequency multiplier chain is used to drive the electron-hole collider so that the electron-hole collider uses HSG to generate a self-referencing frequency comb. Frequency multiplier chains (e.g., manufactured by Virginia Diodes, Inc) are already capable of generating ~10 mW at 500 GHz (http://vadiodes.com/en/products/custom-transmitters). Frequency multiplier chains generate THz radiation by sending a microwave signal (for example, 10 GHz) through a cascade of doublers and triplers.

The output from the doubler or tripler may be amplified by an amplifier (see FIG. 5) so as to obtain a higher power THz output. Examples of amplifiers include, but are not limited to, the following.

Microfabricated vacuum electron devices that currently generate more than 100 mW at 0.67 THz [9]. With appropriate microwave engineering, this power level can generate electric fields in excess of 30 kV/cm between conductors separated by a few microns [4].

Semiconductor-based sub-mmW and THz amplifiers are also under rapid development, with >100 mW achieved at 220 GHz, and >1 mW achieved at 670 GHz [10]. The power levels at 600 GHz and above will rapidly improve over the next few years.

Transistors and millimeter-wave integrated circuits, with appropriate microwave engineering, may also be used as amplifiers to drive a compact electron-hole collider to generate self-referencing frequency combs.

2. HSG Optimization

Materials and/or field conditions for HSG are optimized to obtain a frequency combs having the desired bandwidth capable of self-referencing. The appropriate field conditions may in turn be implemented using careful microwave circuit design. Moreover, HSG may be tailored for specific applications.

a. Scaling the THz Field and Frequency

Figure 3:
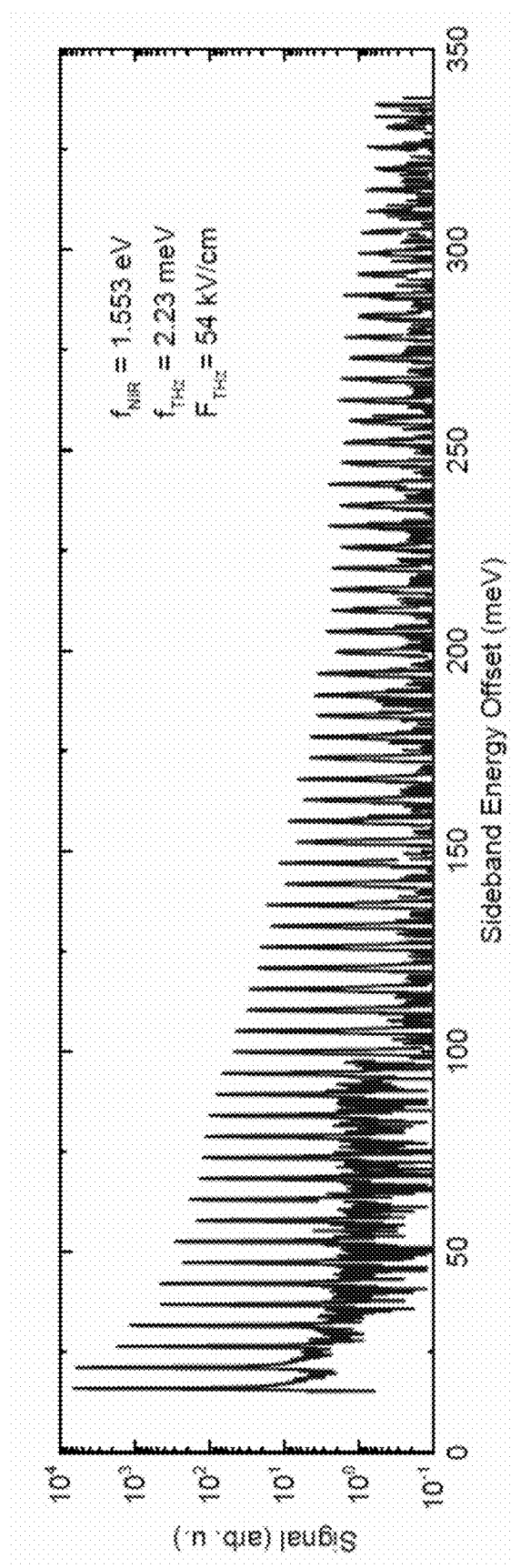
FIG. 3 illustrates a NIR frequency comb generated from high-order sideband generation in a $GaAs/Al_{0.3}Ga_{0.7}As$ multi-quantum well. With a center frequency of 1.553 eV (798.4 nm) and a comb spacing of $2f_{THz}$=4.46 meV, the bandwidth of the comb extends well over 300 meV, over 20% of an octave. Additional negative-order sidebands are also produced.

FIG. 3 depicts a typical HSG spectrum generated using the electron hole collider comprising a GaAs/AlGaAs multi-quantum well structure. The multi-quantum well structure was resonantly excited near the exciton energy by a narrow linewidth NIR laser while simultaneously exposed to a large THz field at 540 GHz (2.23 meV) from the UCSB mm-wave Free-Electron Laser. The resulting spectrum was sent into an imaging spectrometer and shows sharp peaks in frequency spaced by twice the THz energy and spans well over 300 meV.

The details of the spectra generated by HSG can be easily tuned: the center frequency can be shifted by tuning the NIR laser frequency, and the spacing between teeth can be controlled by changing the frequency of the driving THz field. However, it would be of great practical utility to control and predict the overall bandwidth of the comb. Unfortunately, the semiclassical three step model predicts a bandwidth several times larger than is actually observed [4]. The inventors, on the other hand, have discovered a scaling model which can be used to predict and control the bandwidth of the combs by changing the parameters of the driving field.

Consider the time trace of an example driving THz field, shown in the black solid trace of FIG. 4A for a frequency of 340 GHz and 20 kV/cm field strength. According to the three-step model, with effective masses of $m_e^*=0.063m_e$ and $m_{hh}^*=0.1m_e$ and with parabolic bands, the 70th-order sideband is emitted when an exciton is ionized 180 fs before the zero-crossing of the field and the electron and hole recollide 360 fs afterwards (depicted by arrows in FIG. 4A, labeled respectively). The time between ionization and recollision occurs during the linear portion of the oscillating driving field, where $E(t)=F_{340} \sin(\omega_{340}t) \approx F_{340}\omega_{340}t$, with $E(t)$, $F_{340}$, and $\omega_{340}$ being the THz electric field, the magnitude of the field strength at 340 GHz, and the frequency of $f=340$ GHz$=\omega_{340}/2\pi$, respectively.

One would expect that at other frequencies where $F_i\omega_i \approx F_{340}\omega_{340}$, maintaining a similar linear region of the driving field, excitons ionized and recollided at the same times relative to the field zero-crossing would experience nearly identical driving profiles (red dashed and blue dashed-dot profiles in FIG. 4A. Since lower-order sidebands are created from exciton ionization-recollision times which occur at smaller times than those depicted in FIG. 4A, those sidebands will also undergo equivalent accelerations to produce similar sidebands, resulting in comparable overall sideband spectra. FIG. 4B shows the measured sideband spectra for the three field profiles depicted in FIG. 4A, where the NIR excitation energy and power are kept constant. As expected, the three spectra display similar falloff rates and overall bandwidths (the 540 GHz spectra has a much larger noise floor because the data was taken with a much shorter integration time).

Despite the shortcomings of the three step model as applied to HSG for determining the overall bandwidth, the model still provides valuable insight towards understanding the scaling of the bandwidth in HSG with various driving field parameters. Our observations suggest that a constant comb bandwidth can be achieved by appropriately scaling the THz field and frequency. This scaling can be used to control the comb bandwidth when moving to drive HSG with on-chip oscillators instead of a free electron laser, where lower frequencies are more easily achieved than higher frequencies.

Recent results [8] suggest that it is advantageous to use frequencies in excess of 400 GHz for generating frequency combs based on HSG, and that it may be advantageous to use relatively narrow quantum wells to limit the mixing between valence subbands that can reduce the efficiency with which high-order sidebands are generated [3].

b. Materials Selection: Structures Based on the Quaternary Semiconductor Materials System Comprising Indium (in), Gallium (Ga), Arsenic (as) Aluminum (Al) and Phosphorus (P)

Quantum wells and bulk epitaxial layers fabricated from (InGaAsAlP) and lattice-matched to InP substrates can be used for making octave-spanning frequency combs anchored at 1.5 μm. Currently, this material system is a workhorse for the fabrication of lasers and optoelectronics used in optical communications as well as THz electronics. The inventors expect it will be much easier to achieve an octave-spanning comb based on high-order sideband generation in these materials than in the GaAs/AlGaAs system (which requires 750-800 nm lasers to generate electron-hole pairs). First, the frequency of the laser being modulated is about two times smaller, reducing the bandwidth required to span an octave by a factor of two compared with GaAs/AlGaAs. Second, the effective mass of electrons in the InGaAsAlP materials system is smaller than in GaAs, which enables combs spanning a significantly wider frequency range. In the spectrum shown in FIG. 1C (for a GaAs quantum well) the highest-frequency tooth in the comb is already 80 THz above the near-IR laser line. It would be surprising if we could not achieve a comb with the highest tooth 100 THz above a 200 THz laser (spanning ⅔ of an octave, and sufficient for 3f-2f self-referencing, which is described below). Taking into account the presence of some sidebands at frequencies below the NIR laser line, as well as the smaller effective mass in the InGaAsP system, it is very likely that the THz fields used in the experiment of FIG. 1C are already sufficient to generate a comb spectrum spanning a full octave.

3. Application Example: Electron-Hole Collider for Compact Self-Referencing Frequency Combs Used with Optical Clocks A compact electron-hole collider that generates a frequency comb with sufficient bandwidth for self-referencing (for example, an octave-spanning frequency comb) enables the construction of an optical atomic clock based on the principles shown in FIG. 5. The self-referencing scheme is similar to that used in optical atomic clocks that use conventional frequency combs based on mode-locked lasers [11]. The frequency $f_k$ of the $k^{th}$ tooth in a conventional frequency comb is $f_k=f_{ceo}+kf_{rep}$, where $f_{ceo}$ is the carrier envelope offset frequency, k is an integer, and $f_{rep}$ is the repetition rate of the mode-locked laser. Frequency combs based on HSG are anchored to the frequency $f_A$ of a near-IR laser (the comb anchor laser). The frequency of the $k^{th}$ tooth in a frequency comb based on HSG is $f_k=f_A+k\delta$, where $\delta=2f_{THz}$. In self-referencing frequency combs based on HSG, the THz input to the electron-hole collider can be generated by first multiplying the frequency $f_{\mu wave}$ of a microwave source by a large integer N to obtain an output, and then amplifying the output, so that $\delta=2Nf_{\mu wave}$. In the self-referencing scheme proposed in FIG. 5, the comb anchor frequency $f_A$ plays a similar role to that played by $f_{ceo}$ in clocks based on a conventional frequency comb, and the tooth spacing $\delta$ plays a role similar to $f_{rep}$ [11].

The following describes one approach for building an atomic clock based on a frequency comb defined by HSG. The comb anchor laser frequency $f_A$ is doubled to frequency $2f_A$, and this tone is mixed with the $m^{th}$ tooth of the frequency comb at $f_m=f_A+m\delta$. The difference frequency is locked to the frequency of (e.g., a Cesium based) atomic clock $f_{Cs}$. The difference frequency is $(f_A+m\delta)-2f_A$ if $2f_A$ is just above $f_m$, or
$2f_A-(m\delta+f_A)$ if $2f_A$ is just below $f_m$.

After locking, $f_A$ is given by $$f_A = m\delta + f_{Cs}.$$

Figure 5:
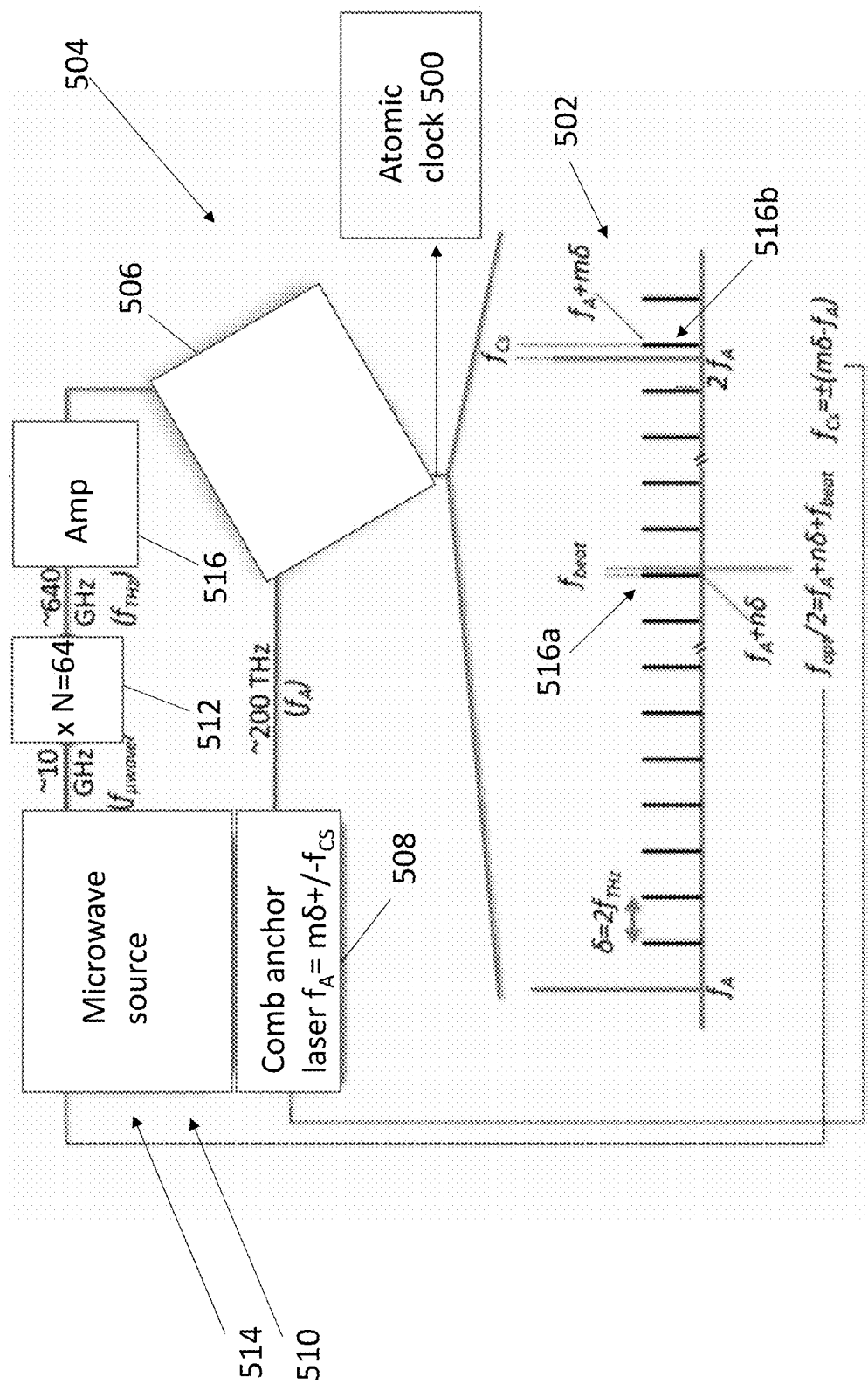
FIG. 5 is a schematic diagram showing the principle of a clock based on a self-referenced, octave-spanning frequency comb generated by high-order sideband generation from an electron-hole collider. All numerical values of frequencies in the figure are examples given for illustrative purposes. A microwave source with frequency $f_{\mu wave}$ is multiplied by N to give rise to a tone at frequency $f_{THz}=Nf_{\mu wave}$. This tone is amplified to become one input to the electron-hole collider. A laser which anchors the frequency comb at frequency $f_A$ is the second input to the electron-hole collider. The output of the electron-hole collider is a frequency comb with frequencies $f_A+2k\delta$, where k is an integer and $\delta=2f_{THz}=2Nf_{\mu wave}$. The self-referencing is accomplished using two standards. The frequency $f_A$ is locked to a Cesium clock with frequency $f_{Cs}$ by the second harmonic of the comb anchor laser at $2f_A$ with the tooth at frequency $f_A+m\delta$. The microwave frequency is locked to an optical frequency standard (for example, $^{87}$Sr, which oscillates near $f_{opt}$=429 THz) by beating a tone at $f_{opt}/2$ with a tooth at $f_A+n\delta$.

The $n^{th}$ tooth of the frequency comb is locked to the frequency of an optical atomic standard $f_{opt}$. As further discussed below, it is expected to be easier to make an octave-spanning comb based on HSG with the anchor laser frequency in the communications band (near 1.5 μm wavelength or 200 THz frequency). In an embodiment using $^{87}$Sr atoms as the standard, the $f_{opt}$ would be close to 429 THz; FIG. 5 illustrates a laser with frequency near $f_{opt}/2$ doubled and locked to the optical standard (near 429 THz). This frequency is mixed with the $n^{th}$ tooth of the comb. The difference frequency $f_{beat}=f_{opt}/2-(f_A+n\delta)$ is counted and used to lock $\delta$ by varying the microwave frequency $f_{\mu wave}=\delta/2N$. After locking, and ignoring the beat frequency, $$f_{\mu wave} = \left(\frac{\frac{f_{opt}}{2} \pm f_{Cs}}{2N(m+n)}\right)$$

Thus, the microwave frequency is directly referenced to the optical standard, and the fluctuations in the frequency of both the optical standard and the Cesium clock are reduced by the large factor $2N(m+n)$. For the example numbers given in FIG. 5, N=64, $\delta$ ~0.64 THz×2=1.28 THz, $f_A$~200 THz, $f_{opt}/2$~214.5 THz, so n~11 and m~160. Thus the factor $2N(m+n)~2\times10^4$.

A miniaturized clock as illustrated in FIG. 5 would be a disruptive technology. FIG. 5 illustrates the clock 500 is coupled to receive the frequency comb 502 generated from a frequency comb generator 504 comprising an electron hole collider 506. The frequency comb is generated in the electron hole collider 506 in response to frequency mixing in the collider 506 of an optical field Eo (received from a comb anchor laser 508) and a terahertz field $E_{THZ}$ (received from a THz source 510). In the example illustrated in FIG. 5, the THz source 510 comprises a frequency multiplier 512 (or, a chain of multipliers) converting a microwave field having a frequency $f_{\mu wave}$ from a microwave source 514 into a terahertz field having a frequency $f_{THz}$; and an amplifier 516 for amplifying the terahertz field. In this example, the multiplier chain multiplying the input frequency of ~10 GHz by a factor of N=64 to obtain a 650 GHz output. The amplified terahertz field at 650 GHz is then coupled into the electron hole collider 504. FIG. 5 further illustrates the teeth 516a, 516b of the frequency comb.

The principal advantage over existing comb-stabilized clocks is that the comb spacing is tuned directly by the clock being stabilized, without the need to tune a physical cavity. Thus, the clock-works are much more robust and agile, and not subject to noise sources associated with the propagation of light through a cavity. A second advantage is that, in contrast to microresonator-based combs, the power in the ~1.5 μm laser generating electron-hole pairs does not affect the stability of the comb. Finally, if a comb is pumped and anchored by a 1.5 μm (200 THz) laser, a 3f-2f self-referencing scheme becomes attractive. A comb in which the highest tooth is at 300 THz can be self-referenced by beating the tripled 200 THz laser with the doubled 300 THz comb tooth at 600 THz. This corresponds to 500 nm—green light (a wavelength very easy to work with).

Moreover, the atomic clock is compact because it is implemented with a compact chip based electron collider, e.g., as illustrated in FIG. 2.

4. Impacts of Polarization

Figures 6A, 6B, 6C:
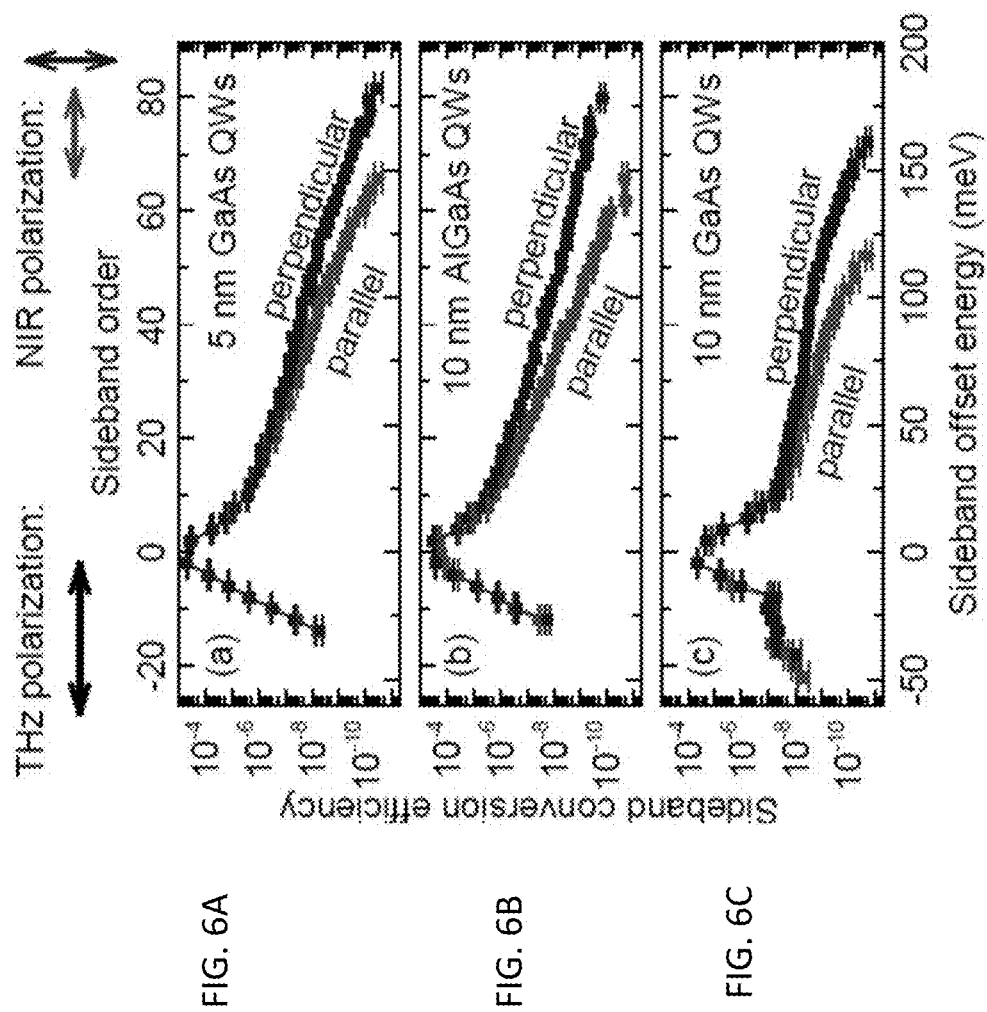
FIGS. 6A-6C illustrate measured sideband conversion efficiency as a function of sideband offset energy in millielectronvolts (meV), for the THz field and optical field having parallel linear polarizations and for the THz field and optical field having perpendicular linear polarizations, and for the semiconductor comprising 5 nm thick GaAs quantum wells (QWs) (FIG. 6A), 10 nm thick AlGaAs QWs (FIG. 6B), and 10 nm thick GaAs QWs (FIG. 6C).

FIGS. 6A-6C illustrate measured sideband conversion efficiency as a function of sideband offset energy, for the THz field having a linear THz polarization that is parallel to the linear polarization of optical field (labeled near infrared (NIR) polarization), and for the THz field having a linear THz polarization that is perpendicular to the linear polarization of the optical field (NIR polarization).

Figures 7, 8A, 8B, 8C, 8D, 8E, 8F, 9A, 9B, 9C:
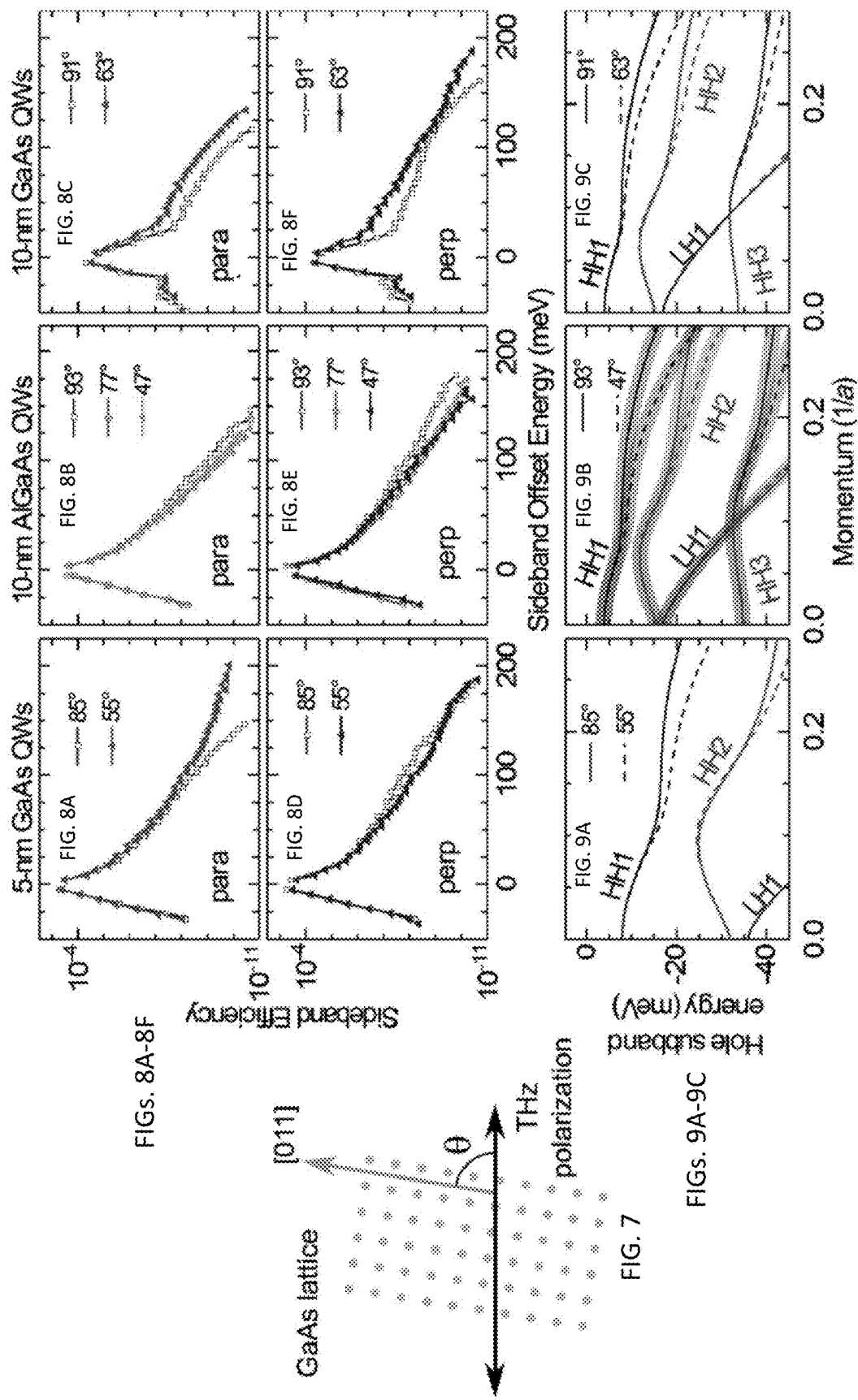
FIG. 7 illustrates orientation angle θ of the THz polarization with respect to the [011] direction of the semiconductor GaAs lattice.
FIGS. 8A-8F illustrated measured sideband conversion efficiency as a function of sideband offset energy (meV), for the semiconductor comprising 5 nm thick GaAs QWs (FIG. 8A, 8D), 10 nm thick GaAs QWs (FIG. 8C, 8F), and 10 nm thick AlGaAs QWs (FIG. 8B, 8E), for different orientation angles θ of the THz polarization with respect to the [100] direction in the GaAs lattice indicated in FIG. 7. The THz field and optical field have parallel linear polarizations in the top three panels of FIG. 8A-8C and the THz field and optical field have perpendicular linear polarizations in the bottom three panels of FIG. 8D-8F.
FIGS. 9A-9C illustrates hole subband energy (in milli electron volts, meV) as a function of momentum (1/a), where a is the lattice constant for GaAs, for the semiconductor comprising 5 nm thick GaAs QWs (FIG. 9A), 10 nm thick GaAs QWs (FIG. 9C), and 10 nm thick AlGaAs QWs (FIG. 9B), along different angles of the momentum with respect to the direction in the GaAs lattice indicated in FIG. 7.

FIGS. 8A-8F illustrates measured sideband efficiency as a function of sideband offset energy for different orientation angles of the THz polarization and optical field polarization with respect to the [011] direction in the GaAs lattice indicated in FIG. 7.

FIGS. 9A-9C illustrates hole subband energy as a function of momentum (1/a), where a is the lattice constant for gallium arsenide (GaAs), for different orientation angles of the THz polarization and optical field polarization with respect to the [011] direction in the GaAs lattice indicated in FIG. 7.

5. Process Steps

Figure 10:
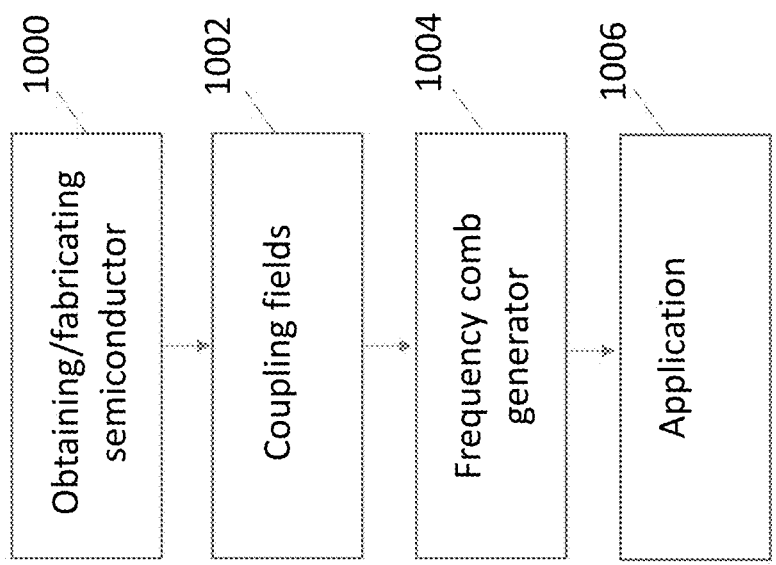
FIG. 10 is a flowchart illustrating a method of fabricating and operating a frequency comb generator.

FIG. 10 is a flowchart illustrating a method of fabricating and using a frequency comb generator or electron collider (referring also to FIG. 2 and FIG. 5).

Block 1000 represents obtaining (or growing and fabricating) a semiconductor 204, 208 capable of outputting a frequency comb 204 in response to frequency mixing of an optical field Eo and a terahertz field $E_{THZ}$ in the semiconductor 204 using a high order sideband (HSG) mechanism.

The semiconductor 204, 208 has a bandstructure, including a valence band and a conduction band, such that the semiconductor 204, 208 outputs the frequency comb 204 in response to the terahertz field $E_{THz}$ driving electrons and holes in the bandstructure, after the optical field Eo excites the electrons into the conduction band and excites the holes into the valence band.

In various examples, the semiconductor comprises a bulk semiconductor, and the bulk semiconductor outputs the frequency comb in response to the terahertz field driving electrons and holes in the bulk semiconductor, after the optical field excites the electrons into the conduction band of the bulk semiconductor and excites the holes into the valence band of the bulk semiconductor. Example bulk semiconductors include, but are not limited to, bulk GaAs, bulk $Al_xGa_{1-x}As$ (0<x≤1), or bulk $In_xGa_{1-x}As_yP_{1-y}$ (0≤x≤1, 0≤y≤1). In one or more examples, the thickness of the bulk semiconductor is between 0.2 and 20 microns thick. In one example, the bulk semiconductor comprises/consists essentially of $In_{0.53}Ga_{0.47}As$ that is about 1 µm thick.

In one embodiment, the bandstructure comprises a quantum well structure 208. Examples of quantum well structures include, but are not limited to, at least one GaAs quantum well having AlGaAs barriers, or $In_xGa_{1-x}As_yP_{1-y}$ lattice-matched to InP. In one example, the quantum well structure comprises one or more $In_{0.47}Ga_{0.53}As$ wells having InP barriers. In one or more examples, the quantum well structure comprises one or more $In_xGa_{1-x}As$ wells with $0.4<x<0.6$, the $In_xGa_{1-x}As$ wells having $In_yAl_{1-y}As$ barriers with $0.4<y<0.6$ or InP barriers.

Figure 11:
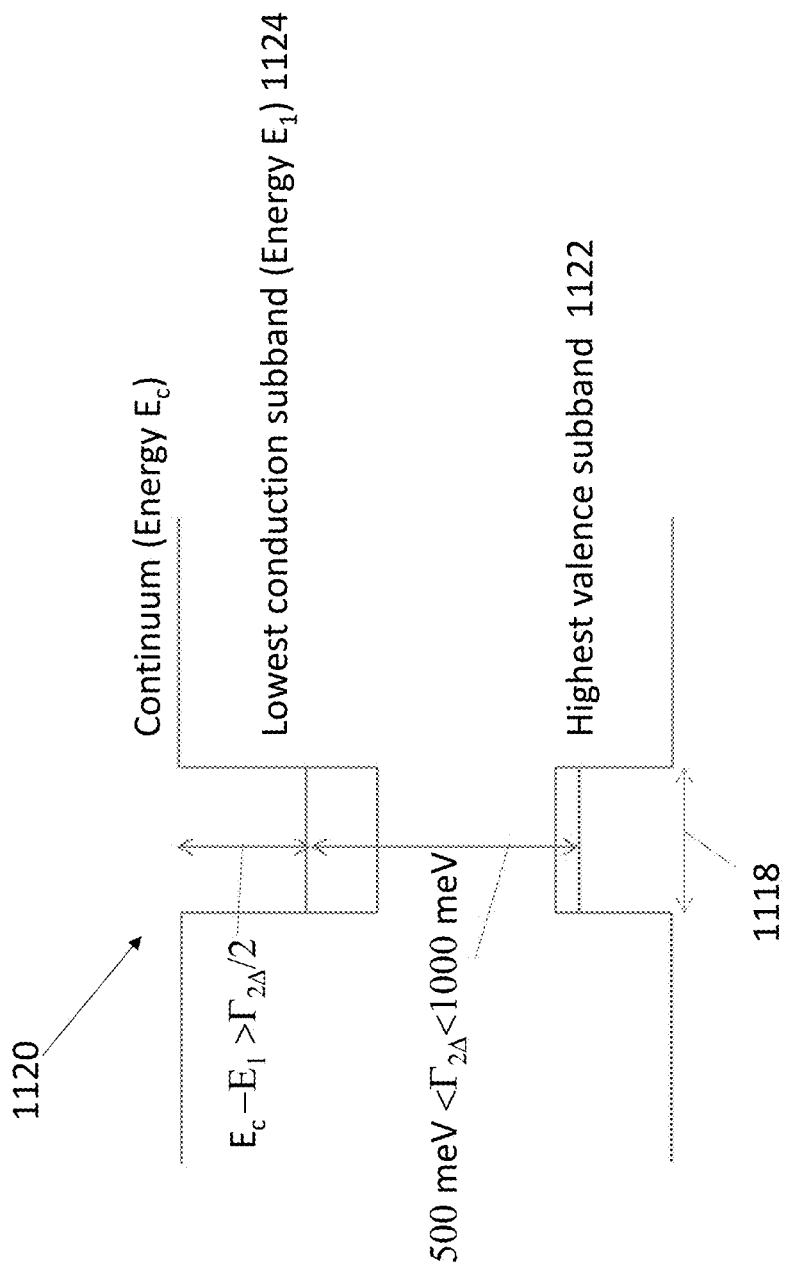
FIG. 11 illustrates a quantum well structure and conduction band offsets in a semiconductor used to generate a frequency comb according to one or more embodiments.

In various examples, the composition and width or thickness 1118 of the quantum wells 1120 are chosen in order to achieve, simultaneously or separately (referring to FIG. 11):

(a) the desired two dimensional (2D) band gap $\Gamma_{2D}$ (the energy difference between top of the highest valence subband 1122 and bottom of the lowest conduction subband 1124, e.g., between 1.65 µm wavelength (750 meV) and 1.3 µm wavelength (950 meV); and/or (b) a splitting between the first two valence subbands below the semiconductor band gap $\Gamma_{2D}$ that is sufficiently large to limit the dynamics of the holes to the first valence subband; and/or (c) an offset $E_c-E_1$ between the 2D band gap (in the quantum well) and the continuum states Ec (in the barrier between quantum wells) that is sufficiently large that electrons and holes do not escape from the quantum wells before recombining to emit sidebands. In one or more examples, the offset $E_c-E_1$ between the bottom of the lowest electron subband 1124 (in the quantum well) and the continuum states Ec (in the barrier between quantum wells) is at least 0.5 times the 2D band gap) so that the electrons with kinetic energy sufficient to emit sidebands with photon energy at least 1.5 times the band gap do not escape from the quantum wells. (10 nm wide $In_{0.53}Ga_{0.47}As$ quantum wells between 30 nm wide $In_{0.52}Al_{0.48}As$ barriers, lattice-matched to InP, are one example of such quantum wells).

The 2D band gap (a) gets bigger as well width is decreased, while offset (c) gets smaller.

In another embodiment, the band structure comprises a layer of a bulk semiconductor whose thickness is chosen to maximize sideband emission given available optical and THz powers. For an epitaxial layer of $In_{0.47}Ga_{0.53}As$ which will have a band gap of 750 meV, the optimal thickness is expected to be between 0.3 and 3 microns.

In one or more embodiments, the step further comprises fabricating a transmission line 210a on the semiconductor 204, 208 that couples the terahertz field $E_{THz}$ into the semiconductor/quantum well structure 204, 208 with an electric field strength of at least 10 kV/cm.

Block 1002 represents positioning a source 510 emitting a terahertz field $E_{THz}$ and a source 508 emitting an optical field Eo, so that the terahertz field and the optical field are coupled to the semiconductor 204. In one example, the terahertz field is coupled to the transmission line 210a.

In one embodiment, the terahertz source 510 comprises a frequency multiplier chain 512 outputting the terahertz field, wherein the frequency multiplier chain 512 converts a microwave field (e.g., at 10 GHz) into the terahertz field (e.g., at 640 GHz).

Examples of terahertz fields include, but are not limited to, terahertz fields having a frequency in a range of 200-900 GHz.

Examples of optical fields include, but are not limited to, optical fields having a wavelength in a range of 700 nm-3 micrometers.

In various examples, the THz frequency and electric field strength are chosen by maximizing the product of the THz frequency and electric field strength available at that frequency.

Block 1004 represents the end result, a frequency comb generator 504 wherein the semiconductor 204, 208 outputs the frequency comb 204 spanning a bandwidth. Examples of bandwidths include, but are not limited to, a bandwidth spanning at least one octave, a bandwidth spanning at least 67% of an octave, or a bandwidth sufficient for 3f-2f self referencing. In one or more examples, the frequency comb has an intensity sufficient for 3f-2f self referencing.

In one or more examples, the optical field and the terahertz field each have a linear polarization and the optical field is polarized perpendicular to the terahertz field.

In one or more examples, the optical field and the terahertz field each have a linear polarization and the optical field is polarized at an angle θ with respect to the terahertz field, with 45 degrees<θ<135 degrees.

In one or more examples, the semiconductor has crystallographic directions (e.g., direction in FIG. 7) and the optical field and terahertz field each have a linear polarization, and the direction of the linear polarization of the terahertz field with respect to the principal axes and a direction of the linear polarization of the optical field with respect to the terahertz field may be chosen together to maximize a bandwidth (e.g., span an octave or obtain sufficient bandwidth of 3f-3f self referencing) of the frequency comb (see, e.g., FIGS. 6A-6C, 7, 8, and 9).

Block 1006 represents the optional step of using the frequency comb in an application.

Figure 12:
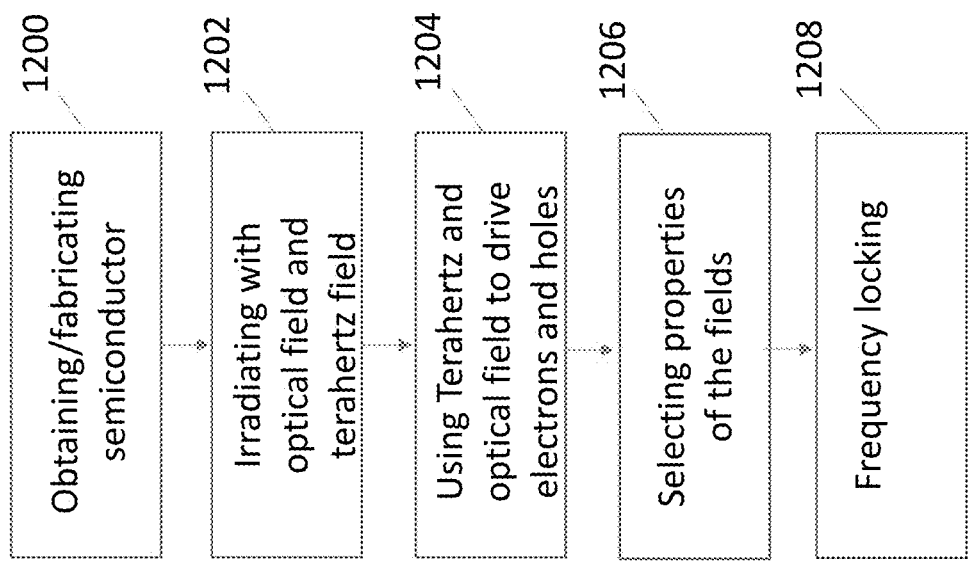
FIG. 12 is a flowchart illustrating a method of operating a frequency comb generator.

FIG. 12 is a flowchart illustrating a method of generating a frequency comb (referring also to FIG. 2 and FIG. 5).

Block 1200 represents obtaining a semiconductor 204 comprising a bandstructure including a valence band, a conduction band, and a bandgap.

Block 1202 represents irradiating the semiconductor 204 with an optical field having a frequency corresponding to an energy equal to or larger than the bandgap, so that the optical field excites electrons into the conduction band and holes into the valence band; using the terahertz field to drive the electrons in the conduction band and drive the holes in the valence band.

Block 1204 represents using a terahertz field to drive the electrons in the conduction band and drive the holes in the valence band.

Block 1206 represents selecting an intensity of the terahertz field, a timing of the terahertz field with respect to the optical field, and the bandstructure such that the semiconductor 204 outputs a frequency comb having a bandwidth sufficient for self-referencing.

In one embodiment, the frequency comb is coupled to an optical clock. For example, one tooth of the frequency comb is locked to a microwave frequency standard, and another tooth of the frequency comb is locked to an optical frequency standard, such that the optical frequency standard stabilizes the microwave frequency standard via the frequency comb.

Block 1208 represents optionally locking one tooth 516a of the frequency comb 502 to a microwave frequency standard; and locking another tooth 516b of the frequency comb to an optical frequency standard; wherein the optical frequency standard stabilizes the microwave frequency standard via the frequency comb.

However, other applications of the frequency comb generator are possible. In another example, the frequency comb generator is coupled to a chemical sensor so as to perform high resolution molecular spectroscopy. The combination of the sensor and the frequency comb generator could be miniaturized so as to be integrated in a mobile device such as a cell phone. In another application, the frequency comb generator is incorporated into an optical communications system wherein each comb tooth may become a carrier of digital or analog information.

REFERENCES

The following references are incorporated by reference herein
[1] T. J. Kippenberg, R. Holzwarth and S. A. Diddams, Science 332 (6029), 555-559 (2011).
[2] T. Herr, K. Hartinger, J. Riemensberger, C. Y. Wang, E. Gavartin, R. Holzwarth, M. L. Gorodetsky and T. J. Kippenberg, Nat Photonics 6 (7), 480-487 (2012).
[3] H. B. Banks, D. Valovcin, Q. Wu, S. Mack, A. C. Gossard, L. N. Pfeiffer, R.-B. Liu and M. S. Sherwin, Physical Review X 7, 01042 (2017).
[4] B. Zaks, R. B. Liu and M. S. Sherwin, Nature 483 (7391), 580-583 (2012).
[5] B. Zaks, H. Banks and M. S. Sherwin, Applied Physics Letters 102 (1) (2013).
[6] H. Banks, B. Zaks, F. Yang, S. Mack, A. C. Gossard, R. Liu and M. S. Sherwin, Phys Rev Lett 111 (26), 267402 (2013).
[7] H. B. Banks, A. Hofmann, S. Mack, A. C. Gossard and M. S. Sherwin, Applied Physics Letters 105 (9) (2014).
[8] H. B. Banks, D. Valovcin, S. Mack, A. C. Gossard and M. S. Sherwin, in preparation (2017).
[9] J. C. Tucek, M. A. Basten, D. A. Gallagher and K. E. Kreischer, 2013 Ieee 14th International Vacuum Electronics Conference (Ivec) (2013).
[10] V. Radisic, K. M. K. H. Leong, D. W. Scott, C. Monier, X. B. Mei, W. R. Deal and A. Gutierrez-Aitken, Ieee Mtt S Int Micr (2015).
[11] A. D. Ludlow, M. M. Boyd, J. Ye, E. Peik and P. 0. Schmidt, Reviews of Modern Physics 87, 637-701 (2015).
[12] Appendix A of U.S. Provisional Patent Application Ser. No. 62/479,808: doctoral dissertation entitled "Electron-Hole Recollisions in Driven Quantum Wells," by Hunter Bennett Banks (December 2016).
[13] Appendix B of U.S. Provisional Patent Application Ser. No. 62/479,808: Abstract entitled "Bandwidth Control of Near Infrared Frequency Combs in High-Order Sideband Generation," by Darren Valovcin, Hunter B. Banks, Shawn Mack, Art C. Gossard, Loren Pfeiffer, and Mark S. Sherwin.
[14] Appendix C of U.S. Provisional Patent Application Ser. No. 62/479,808: manuscript entitled "Dynamical birefringence: Electron-hole recollisions as probes of Berry curvature," by Hunter B. Banks, Darren Valovcin, Qile Wu, Shawn Mack, Arthur C. Gossard, Loren Pfeiffer, Ren-Bao Liu, and Mark S. Sherwin.
[15] Appendix D of U.S. Provisional Patent Application Ser. No. 62/479,808: Abstract entitled "Berry Curvature Induced Dynamical Birefringence from Electron Hole recollisions, by Darren Valovcin, Hunter B. Banks, Qile Wu, Shawn Mack, Art C. Gossard, Loren Pfeiffer, Ren-Bao Liu, and Mark S. Sherwin.
[16] Victor Tones-Company and Andrew M. Weiner, Laser Photonics Rev. 8, No. 3, 368-393 (2014)/DOI 10.1002/lpor.201300126].
[17] Katja Beha, Daniel C. Cole, Pascal Del'Haye, Aurelien Coillet, Scott A. Diddams, and Scott B. Papp, Optica 4 (4) 407-411 (2017)/DOI 10.1364/OPTICA.4.000406.
[18] Further information on one or more embodiments of the present invention can be found in the attached unpublished manuscript entitled "optical frequency combs from high order side band generation." by Darren C. Valovcin, Hunter B. Banks, Shawn Mack, Arthur C. Gossard, Loren Pfeiffer and Mark S. Sherwin.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A frequency comb generator, comprising:
a semiconductor outputting a frequency comb in response to frequency mixing of an optical field and a terahertz field in the semiconductor, wherein:
the semiconductor has a bandstructure, including a valence band and a conduction band, such that the semiconductor outputs the frequency comb in response to the terahertz field driving electrons and holes in the bandstructure, after the optical field excites the electrons into the conduction band and excites the holes into the valence band.
2. The frequency comb generator of claim 1, wherein the frequency comb has a bandwidth spanning at least one octave.
3. The frequency comb generator of claim 1, wherein the frequency comb has a bandwidth spanning at least 67% of an octave.
4. The frequency comb generator of claim 1, wherein the frequency comb has a bandwidth sufficient for 3f-2f self referencing.
5. The frequency comb generator of claim 1, further comprising a transmission line on the semiconductor, wherein the transmission line may include a resonator that enhances the terahertz field so that the transmission line couples the terahertz field into semiconductor with an electric field strength of at least 10 kV/cm.
6. The frequency comb generator of claim 1, wherein a THz frequency and electric field strength of the terahertz field are chosen by maximizing the product of the THz frequency and electric field strength available at that frequency.
7. The frequency comb generator of claim 1, wherein:
the semiconductor comprises a bulk semiconductor, and the bulk semiconductor outputs the frequency comb in response to the terahertz field driving electrons and holes in the bulk semiconductor, after the optical field excites the electrons into the conduction band of the bulk semiconductor and excites the holes into the valence band of the bulk semiconductor.
8. The frequency comb generator of claim 7, wherein the bulk semiconductor comprises bulk GaAs, bulk $Al_xGa_{1-x}As$ ($0<x\leq1$), or bulk $In_xGa_{1-x}As_yP_{1-y}$ ($0\leq x\leq1$, $0\leq y\leq1$) and where the thickness of the bulk semiconductor is between 0.2 and 20 microns thick.
9. The frequency comb generator of claim 7, wherein the bulk semiconductor comprises $In_{0.53}Ga_{0.47}As$ that is about 1 µm thick.

10. The frequency comb generator of claim 1, wherein the bandstructure comprises a quantum well structure.

11. The frequency comb generator of claim 10, wherein the quantum well structure comprises GaAs quantum wells and $Al_xGa_{1-x}As$ barriers.

12. The frequency comb generator of claim 10, wherein the quantum well structure comprises $In_xGa_{1-x}As_yP_{1-y}$ lattice-matched to InP.

13. The frequency comb generator of claim 10, wherein the quantum well structure comprises one or more $In_xGa_{1-x}As$ wells with $0.4<x<0.6$, the $In_xGa_{1-x}As$ wells having $In_yAl_{1-y}As$ barriers with $0.4<y<0.6$ or InP barriers.

14. The frequency comb generator of claim 10, wherein the composition and width of the quantum wells are chosen in order to achieve, simultaneously:
  a. a desired two dimensional (2D) band gap (the energy difference between a top of the highest valence subband band and a bottom of the lowest conduction subband) is between 500 meV and 1000 meV;
  b. an offset between the bottom of the lowest electron subband (in the quantum well structure) and the continuum states (in the barrier between quantum wells) that is at least 0.5 times the 2D band gap so that the electrons with kinetic energy sufficient to emit the sidebands with a photon energy at least 1.5 times the band gap do not escape from the quantum wells.

15. The frequency comb generator of claim 1 coupled to an optical clock.

16. The frequency comb generator of claim 15, wherein:
  one tooth of the frequency comb is locked to a microwave frequency standard, and
  another tooth of the frequency comb is locked to an optical frequency standard, such that the optical frequency standard stabilizes the microwave frequency standard via the frequency comb.

17. The frequency comb generator of claim 1 coupled to:
  a source emitting the terahertz field having a frequency in a range of 200-900 GHz, and
  a source emitting the optical field having a wavelength of 700 nm-3 micrometers.

18. The frequency comb generator of claim 1 coupled to a source comprising a frequency multiplier chain outputting the terahertz field, wherein the frequency multiplier chain converts a microwave field into the terahertz field.

19. The frequency comb generator of claim 1, wherein:
  the semiconductor has crystallographic directions,
  the optical field and terahertz field each have a linear polarization, and
  a direction of the linear polarization of the terahertz field with respect to the crystallographic directions, and a direction of the linear polarization of the optical field with respect to the terahertz field, are chosen together to maximize a bandwidth of the frequency comb.

20. The frequency comb generator of claim 1, wherein the optical field and the terahertz field each have a linear polarization and the optical field is polarized at an angle $\theta$ with respect to the terahertz field, with 45 degrees$<\theta<$135 degrees.

21. A method of generating a frequency comb, comprising:
  obtaining a semiconductor comprising a bandstructure including a valence band, a conduction band, and a bandgap;
  irradiating the semiconductor with an optical field having a frequency corresponding to an energy equal to or larger than the bandgap, so that the optical field excites electrons into the conduction band and holes into the valence band;
  using a terahertz field to drive the electrons in the conduction band and drive the holes in the valence band; and
  selecting an intensity of the terahertz field, a timing of the terahertz field with respect to the optical field, and the bandstructure such that the semiconductor outputs a frequency comb having a bandwidth sufficient for self-referencing.

22. A frequency comb generator, comprising:
  a semiconductor outputting a frequency comb in response to frequency mixing of an optical field and a terahertz field in the semiconductor using a high order sideband generation (HSG) mechanism, wherein:
  the semiconductor has a bandstructure, including a valence band and a conduction band, such that the optical field excites electrons into the conduction band and excites holes into the valence band;
  the HSG mechanism comprises:
    the terahertz field:
      ionizing the electrons and the holes, and
      accelerating the electrons and the holes first away from each other and then back towards each other, and
    when the electrons and the holes recombine, emitting excess kinetic energy of the electrons and holes in sidebands with higher frequency than the optical field; and
  the frequency comb comprises the sidebands.

* * * * *